United States Patent [19]

Baker et al.

[11] 4,007,103

[45] * Feb. 8, 1977

[54] PLANARIZING INSULATIVE LAYERS BY RESPUTTERING

[75] Inventors: Theodore Harris Baker, Wappingers Falls; Majid Ghafghaichi, Poughkeepsie; Richard Charles Stevens, Poughkeepsie; Hans Wimpfheimer, Poughkeepsie, all of N.Y.

[73] Assignee: IBM Corporation, Armonk, N.Y.

[ * ] Notice: The portion of the term of this patent subsequent to Sept. 28, 1993, has been disclaimed.

[22] Filed: Oct. 14, 1975

[21] Appl. No.: 621,899

[52] U.S. Cl. .............................................. 204/192
[51] Int. Cl.² .......................................... C23C 15/00
[58] Field of Search ................................... 204/192

[56] References Cited
UNITED STATES PATENTS

| | | | |
|---|---|---|---|
| 3,474,021 | 10/1969 | Davidse et al. | 204/192 |
| 3,804,738 | 4/1974 | Lechaton et al. | 204/192 |

*Primary Examiner*—John H. Mack
*Assistant Examiner*—Aaron Weisstuch
*Attorney, Agent, or Firm*—J. B. Kraft

[57] ABSTRACT

A method of planarizing an electrically insulative layer formed over a non-planar integrated circuit substrate having raised portions. After the electrically insulative layers are deposited over such substrate, the layer has elevations corresponding to the underlying raised portions of the substrate. A masking layer is formed on the electrically insulative layer having at least one opening therethrough coincident with an elevation in the insulative layer; this opening has smaller lateral dimensions than the coincident elevation, thereby facilitating alignment. The elevation in the insulative layer exposed in said at least one opening is then etched to the level of the unelevated portion of the layer, and the insulative layer is then resputtered for a period of time sufficient to planarize the remainder of such etched elevation to the level of the unelevated portions.

10 Claims, 13 Drawing Figures

PLANARIZING INSULATIVE LAYERS BY RESPUTTERING

BACKGROUND OF THE INVENTION

The present invention relates to methods of sputtering and, more particularly, to methods of resputtering layers of electrically insulative materials used in integrated semiconductor circuits. In the construction of thin film integrated semiconductor circuits wherein the passivating or insulating layer is deposited over a non-planar integrated circuit substrate, e.g., a substrate having etched recesses or one having a raised conductive line pattern, the insulative layer will follow the contours of the underlying non-planar substrate, i.e., the insulative layer will have raised portions or elevations corresponding to the elevations in the non-planar substrate.

As set forth in U.S. Pat. No. 3,804,738, the art has recognized the advantages of removing all elevations from a deposited insulative layer by resputtering to planarize the surface of the layer. Such planarization of insulative layers was considered to be particularly desirable in structures having several levels of metallurgy separated by several layers of insulative material. In such multi-layered structures, cumulative effects of several levels of raised metallization of the final insulative layer would be very pronounced and undesirable. Consequently, the advantage of completely planarizing each of several insulative layers to avoid the overall cumulative effect is apparent. Such complete planarization by resputtering is very effective. However, it is very time-consuming. For example, it takes up to about twenty-four hours of RF resputtering to completely planarize a conventional silicon dioxide layer deposited over a metallization pattern having raised lines in the order of from 300 to 1500 micro-inches in width, a conventional width for present-day integrated circuit structures.

The phenomenon of resputtering, in general, is known in the art and involves the re-emission of deposited insulative material, such as $SiO_2$, during the sputter deposition thereof through the effects of attendant ion bombardment of the deposited insulative layer. This resputtering approach was first disclosed in the publication. "Thin Films Deposited by Bias Sputtering," L. I. Maissel et al., *Journal of Applied Phsyics*, January 1965, p. 237, as a modified DC sputtering technique known as Biased Sputtering. The application of the principles of resputtering to RF sputtering is disclosed in an article, "Re-Emission Coefficients of Silicon and Silcion Dioxide Films Deposited Through RF and DC Sputtering," R. E. Jones et al., *Journal of Applied Physics*, Nov. 1967, p. 4656. In effect, resputtering is the positive ion bombardment of an insulative film during its deposition. The prior art has recognized that resputtering improves the quality of sputter deposited film; U.S. Pat. No. 3,661,761, discloses the use of RF sputtering to improve film quality and uniformity.

While resputtering has been used to some extent in the commerical fabrication of integrated circuits for the purpose of improving the quality of sputter deposited film, the use of resputtering for complete planarization has been quite limited because of the great amount of time necessary to achieve complete planarization of an insulative layer deposited over raised metallized line patterns of conventional width.

In addition, the use of deposited layers of insulative material in forming lateral dielectric isolation in integrated circuits has been very limited because of the absence of an effective technique for planarizing a layer of deposited insulative material so that the surface of the insulative layer over unrecessed portions of the substrate is substantially coplanar with the surface of insulative material deposited in the recesses in the substrate to provide the dielectric isolation.

Such dielectrically isolated integrated circuits are characterized by patterns of moats or trenches extending from the surface of a semiconductor substrate to isolate respectively a plurality of pockets on the semiconductor material. Where the dielectric or insulative layers are deposited over such mesa-like structures, the result is a pattern of steps or elevations in the insulated layer corresponding to the pattern of mesas in the substrate. Depending on the techniques utilized to fill the trenches or moats with dielectric material, these steps may often be quite steep which, as previously mentioned, could result in discontinuities in the metallization placed on the insulative layer.

In order to avoid such variation in the insulative layer, one approach in the art has been to oxidize the silicon substrate surrounding the trench or moat by heating to form thermal oxide which fills in the trench providing the lateral insulation and a relatively planar surface upon which surface insulative layers can thereafter be applied. This process is described in detail in an article entitled, "Local Oxidation of Silicon and Its Applications in Semiconductor Device Technology," J. A. Appels et al, *Phillips Research Reports* 25, p. 118, 1970. While this approach may be used in methods where it is possible to oxidize the substrate in situ to fill in the trenches, the art has yet to develop a practical approach wherein planarization may be achieved in a method wherein the trenches are filled with the dielectric or insulative material by deposition techniques such as vapor deposition or RF sputter deposition. The problems involved in the planarization of such deposited insulative layers are essentially the same as those previously described with respect to planarization of insulative layers over a metallization pattern except that the steps or elevations often tend to be even higher, thereby making the problem even more difficult.

As an alternative to resputtering, the prior art has also considered an approach involving masking the depressed areas or valleys with an etch-resistant material such as photoresist through conventional photolithographic techniques, and then etching to remove the uncovered elevations or steps. This approach often runs into problems with photoresist mask alignment. In high density large-scale integrated circuits, the dimensions are so minute that difficulties may be encountered in obtaining the exact registration required to completely mask the depressed areas or valleys with photoresist. Any misalignment which leaves a portion of a depressed area exposed could result in an etch through the insulative layer in said depressed area simultaneously with the planarization of the elevated area. This will result in an undesirable short circuit path through the insulative layer in the depressed area.

SUMMARY OF THE INVENTION

Accordingly, it is a primary object of the present invention to provide a method for lowering elevated areas on a substrate surface having a pattern of elevated areas and a complementary pattern of unelevated areas, which method is substantially faster than conventional resputtering methods and is free from the misalignment problem of etching methods.

It is another object of the present invention to provide a method for lowering the elevated areas in an insulative layer over an integrated circuit, which method is substantially faster than conventional resputtering methods and is free from the misalignment problems of etching methods.

It is yet another object of the present invention to provide a method for lowering elevations in an insulative layer formed over a metallization pattern in an integrated circuit, which method is substantially faster than conventional resputtering methods and free from misalignment problems of etching methods.

It is yet another object of the present invention to provide a method for lowering elevations in an insulative layer formed over an integrated circuit surface having pockets of semiconductor material surrounded by trenches, which method is substantially faster than conventional resputtering methods and free from the misalignment problems of etching methods.

In accordance with the present invention, a method is provided for planarizing an insulative layer deposited over a non-planar integrated circuit substrate which layer has elevations corresponding to underlying raised portions of the substrate comprising forming on the electrically insulative layer, a masking layer of etch resistant material, e.g., photoresist material, having at least one opening therethrough coincident with an elevation in the insulative layer; the opening or openings have smaller lateral dimensions than the coincident elevations, thereby providing sufficient tolerance for the alignment of the opening.

The structure is then subjected to an etching process, preferably chemical etching, which results in the planarization of those portions of elevations which are exposed in said opening down to the level of the unelevated portions of the insulative layer. The structure is then subjected to resputtering for a time sufficient to planarize the remainder of the previously etched elevation to a level of the unelevated portions of the insulative layer. This method may be most effectively used in the planarization of all of the elevations in the deposited insulative layer by the two-step procedure involving, in effect, removing by chemical etching the middle portion of each elevation, followed by resputtering to complete the planarization by removing the remaining end portions of each elevation in a relatively short resputtering cycle because the lateral dimensions of such remaining portions are relatively narrow.

The method is equally effective whether non-planarity of the insulative layer is due to an underlying pattern of recesses in the substrate or to a deposited metallization pattern on the substrate.

In accordance with one aspect of the present invention, the openings through the photoresist masking layer which define the extent of the initial etching step respectively have lateral dimensions smaller by the same amount from the coincident elevations, i.e., the wider the elevation, the wider the coincident opening through the photoresist masking layer. By this approach, subsequent to etching, the remaining portion of each elevation will have the same lateral dimensions irrespective of the initial lateral dimensions of the elevation. As a result, during the resputtering step all of the remaining portions of the elevation will become planarized within substantially the same time cycle.

In accordance with another aspect of the present invention, where the insulative layer is formed over an underlying metallization line pattern, the same photoresist exposure mask previously utilized to define metallization line pattern in any conventional photolithographic fabrication technique, may then be used as the photoresist exposure mask in the formation of the photoresist masking layer for the planarization etch step.

The foregoing and other objects, features and advantages of the invention will be apparent from the following more particular description of the preferred embodiments of the invention, as illustrated in the accompanying drawings.

DESCRIPTION OF THE PREFERRED EMBODIMENTS

Figure 1A:
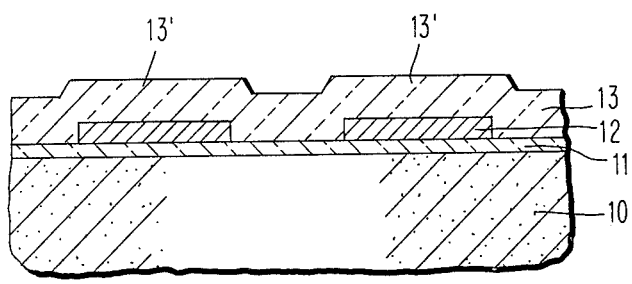
FIGS. 1A – 1D are diagrammatic cross-sectional views of a portion of an integrated circuit chip illustrating a preferred embodiment of the present invention for planarizing a layer of insulative material deposited over a metallization pattern.

With reference to FIGS. 1A – 1D, there will now be described the method of the present invention as applied to planarization of a layer of insulative material deposited over a metallization line pattern. The structure shown in these figures is a portion of an integrated circuit chip. The structure may be formed in any of the conventional integrated circuit fabrication techniques such as those described in U.S. Pat. No. 3,539,876. Silicon substrate 10 has formed thereon a bottom layer of insulative material 11 which may be silicon doxide formed by the thermal oxidation of the surface of substrate 10 or a material deposited by chemical vapor deposition or sputtering. Such materials include silicon dioxide, silicon nitride or aluminum oxide. Layer 11 acts to passivate or protect the silicon substrate as well as to electrically isolate substrate 11 from a metallization interconnection pattern 12. The metallization pattern is formed on a layer 11 by conventional integrated circuit fabrication techniques as described in U.S. Pat. No. 3,539,876, e.g., by photolithographic etching or lift-off techniques. The metallization pattern is selectively connected to devices not shown at the surface of substrate 10 by connectors, not shown, selectively passing through the insulative layer 11 to the substrate. The metallization pattern is covered by an over-layer 13 of insulative material, such as silicon dioxide, which protects and insulates the metallization pattern. Metallization pattern 12 may be any conventional metal used in integrated circuits, such as aluminum, aluminum-copper alloys, platinum, palladium, chromium or molybdenum.

Some typical dimensions for the layers of FIG. 1A in conventional high density integrated circuits would be: a layer 11, a thickness in the order of 1,000 A; metallization pattern 12, a thickness in the order of 10,000 A; and over-layer 13, a thickness in the order of 24,000 A.

Figure 1B:
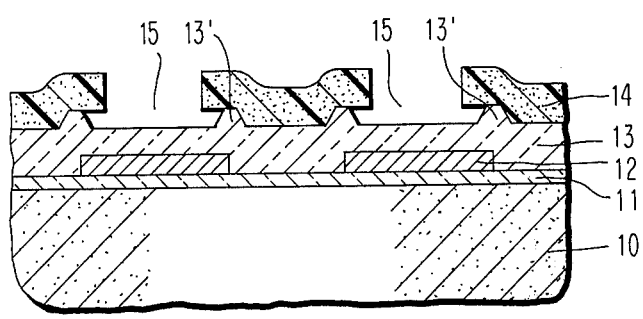

As shown in FIG. 1B, photoresist mask 14 having a thickness in the order of 20,000 A is formed over the structure by conventional photoresist deposition exposure and development techniques utilized in the integrated circuit art. The mask has openings 15 in registration with elevations 13' in insulative layer 13. Openings 15 have smaller lateral dimensions than elevations 13'.

Further, in order to produce the structure shown in FIG. 1B, conventional photolithographic etching techniques are utilized with a standard etchant for insulative layer 13 to planarize the portions of elevation 13' exposed through openings 15 down to the level of the unelevated portions of insulative layer 13. Let us assume for the present example that layer 13 is a silicon dioxide layer having a thickness in the order of 24,000 A. For such a layer, treatment with a buffered HF etching solution for approximately five to ten minutes should produce the final results shown in FIG. 1B.

Figure 1C:
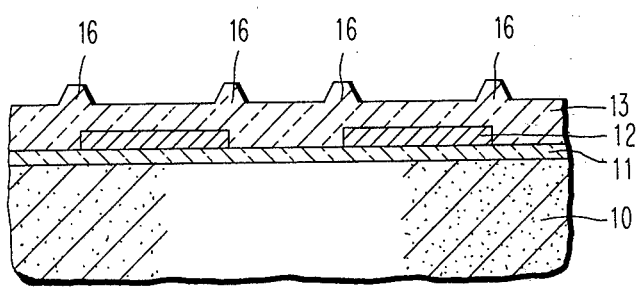

Then, utilizing conventional photoresist stripping techniques, photoresist mask 14 is removed leaving the structure shown in FIG. 1C wherein each of the elevations has a pair of unetched peripheral bumps 16 which are substantially narrower in width than original elevations 13' (FIG. 1A).

Next, using standard resputtering equipment and techniques which may conveniently be prior art RF sputtering apparatus shown and described in U.S. Pat. No. 3,804,738, particularly with respect to FIG. 5 thereof, insulative layer 13 is resputtered at substantially zero deposition rate, i.e., the rate of deposition of insulative material onto layer 13 is equal to the rate of re-emission from layer 13 until bumps 16 are removed to produce the structure shown in 1D. During this resputtering, the overall thickness of layer 13 does not change appreciably. However, bumps 16 narrow inwardly from their edges until they virtually disappear, producing the planarized structure in FIG. 1D.

By way of example, when operating under the conditions for resputtering described in U.S. Pat. No. 3,804,738, in combination with the above described etching techniques, and when utilizing a metallization pattern wherein the thickness of the metallization lines are in the order of 8,000 A and the thickness level of silicon doxide layer 13 after planarization is in the order of 21,000 A, the rates of planarization by means of resputtering of elevations or bumps above the metallization lines would be about one minute for each micro-inch (250 A) of width of each of the elevations. In conventional metallization patterns, lines have width in the order of from 400 – 1,000 micro-inches. The resulting widths of elevations in the insulative layer produced above such lines may range from 600 – 1500 micro-inches.

In considering the effect of the reduction in time required for planarization by resputtering using the method of the present invention, with an elevation 1,000 micro-inches in width, the etching step in the method of the present invention may be utilized to reduce each elevation to a pair of bumps each 100 micro-inches in width, thereby reducing the resputtering time required for complete planarization from about 17 hours down to a little over one and one-half hours.

Figure 2A:
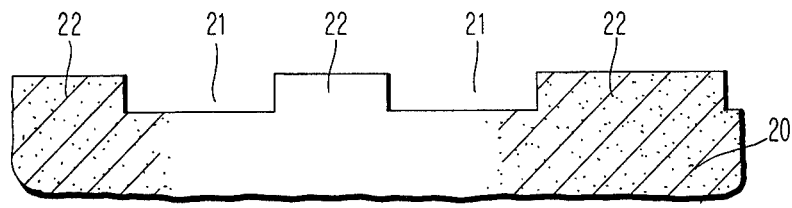
FIGS. 2A – 2E are diagrammatic cross-sectional views of a portion of an integrated circuit chip illustrating a preferred embodiment of the present invention for planarizing a layer of insulative material deposited over a recessed semiconductor substrate.

Referring now to FIGS. 2A – 2E, there will be described an aspect of the present invention involving the planarization of an insulative layer deposited over a silicon substrate having a plurality of recesses or trenches. In FIG. 2A, commencing with a silicon substrate 20 which may be an N- epitaxial layer formed in accordance with the procedure set forth in U.S. Pat. No. 3,539,876, a pattern of trenches 21 are formed to laterally isolate a plurality of silicon mesas 22. Trenches 21 may be formed by any conventional integrated circuit photolithographic fabrication technique, e.g., by masking silicon substrate 20 with a silicon nitride mask (not shown), which for best results would be a conventional composite mask comprising a silicon dioxide bottom layer and a silicon nitride top layer, trenches 21 are etched in the silicon with an etchant which selectively etches the silicon to a depth of 1 – 2 microns. A typical etchant is a diluted nitric acid-hydrofluoric acid solution comprising 500 parts by volume 70% nitric acid, 500 parts iodine-saturated nitric acid, 14 parts 40% amonium fluoride, 2 parts 49% hydrofluoric acid and 5 parts 98% acetic acid. Upon completion of the etching step, the etch mask is removed leaving the structure shown in FIG. 2A.

Figure 2B:
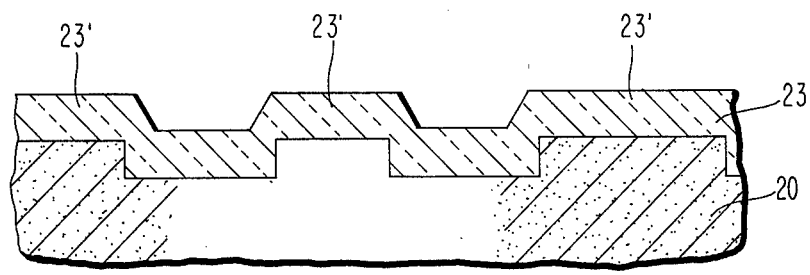

Next, FIG. 2B, layer 23 of an electrically insulative material which is selected to provide the lateral dielectric isolation within trenches 21 is deposited to a thickness in the order of 1.2 – 2.2 microns which is sufficient to substantially fill the trenches. During the deposition process, layer 23 is also deposited over the surface of the structure. Portions of layer 23 on the surface provide elevated areas 23'. In the present embodiment, insulative layer 23 comprises silicon dioxide. It may be deposited by any conventional method of silicon dioxide deposition such as RF sputter deposition or chemical vapor deposition. It may also be formed by the thermal oxidation of recessed silicon substrate 20.

Figure 1D:
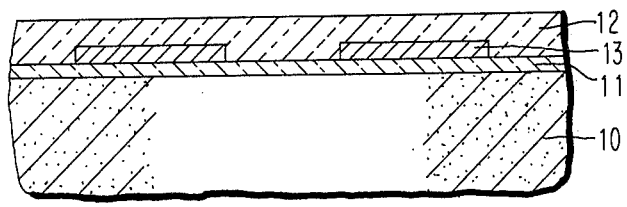
Figure 2C:
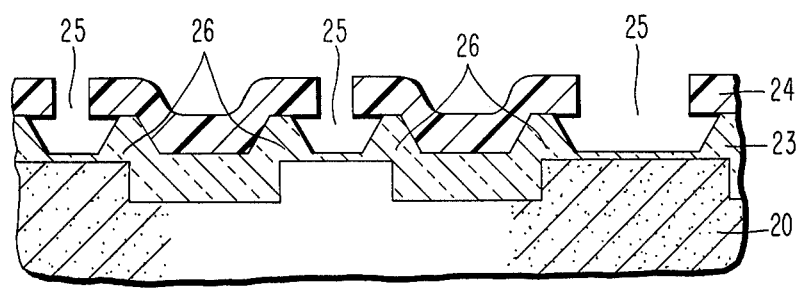

From this point on, the process parallels that previously described with respect to FIGS. 1B – 1D. As desecribed with respect to FIG. 1B, the structure shown in FIG. 2C is formed by first forming photoresist mask 24 with openings having lateral dimensions which are smaller than elevations 23'. The structure is then chemically etched through openings 25 to planarize the portions of elevations 23' exposed in such openings to leave peripheral stubs 26 which have lateral dimensions which are substantially smaller than those of elevations 23'. Again it should be noted that for best results the lateral dimensions of apertures 25 in photoresist layer 24 are selected so that resulting elevated stubs 26 will be uniform in lateral dimensions. In this connection, it is observed with respect to FIG. 2C that the lateral dimensions of apertures 25 vary so that all of said openings are smaller by the same amount from their respective coincident elevations.

Figure 2D:
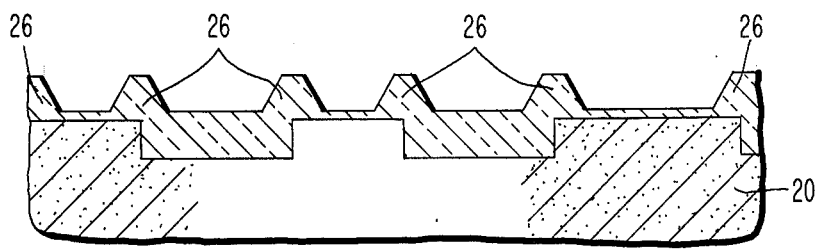
Figure 2E:
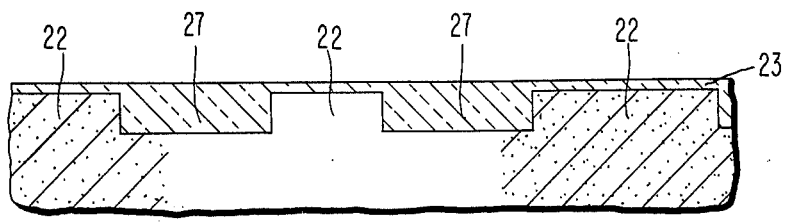

Then, following a procedure substantially identical as that set forth with respect to FIGS. 1C and 1D, the photoresist mask 24 is removed conventionally and the structure shown in FIG. 2D subjected to RF resputtering to provide the final planar structure shown in FIG. 2E comprising silicon pockets 22 which are laterally dielectrically isolated by a pattern of recessed silicon dioxide 27, the surfaces of which are covered by a thin planar passivating layer 23 of silicon dioxide. With the structure of 2E, it is now possible to perform appropriate conventional introduction of impurities into selected silicon pockets 22 merely by the removal of all or a portion of the silicon dioxide layer 23 covering the respective pocket and diffusing or ion implanting into the exposed portion of the pocket utilizing the conventional integrated circuit fabrication techniques.

Figure 3A:
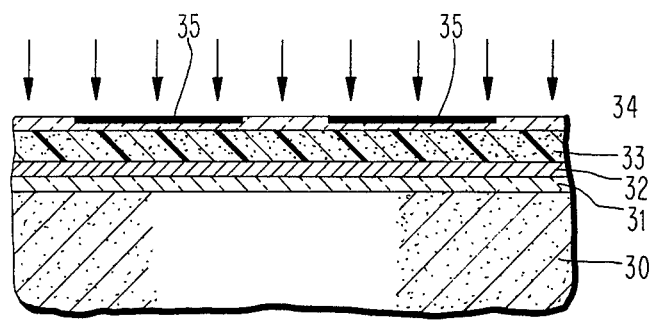
FIGS. 3A – 3D are diagrammatic cross-sectional views of a portion of an integrated circuit chip illustrating another aspect of the present invention.

With respect to FIGS. 3A – 3D, there will now be described a variation of the present invention which results in a saving in mask making, i.e., it eliminates at least one mask making step. With reference to FIG. 3A, a standard structure is shown for the exposure of photoresist in the formation of a metallization line pattern. Silicon dioxide layer 31 is formed on silicon substrate 30. A layer of metal 32 of the type previously described is deposited on insulative layer 31 and a photoresist coating 33 formed over the metal. The structure is exposed to light through any conventional contact mask 34 utilizable in conventional integrated circuit fabrication. For convenience in the structure shown, the photoresist is a positive photoresist, i.e., the portions of the photoresist under opaque portions 35 of the mask remain insoluble while the remaining portions of the photoresist are exposed to light and rendered soluble. Alternatively, the negative photoresist may be used in which case the opaque and transparent portions in mask 34 would be reversed.

Figure 3B:
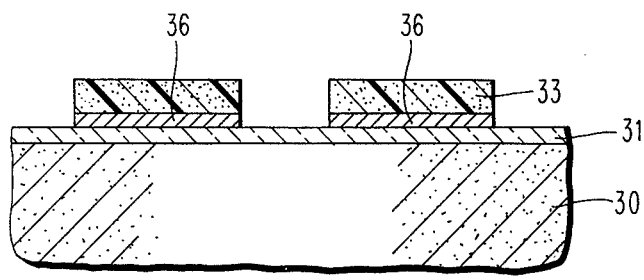

In any event, the photoresist is developed and utilized as an etch barrier mask to shield those portions of the metallization layer which are to remain as the line pattern while the remainder of the metallization layer 32 is etched away utilizing conventional photolithographic etcing techniques in the integrated circuit art to produce the structure in FIG. 3B, having a pattern of metallization lines 36.

Figure 3C:
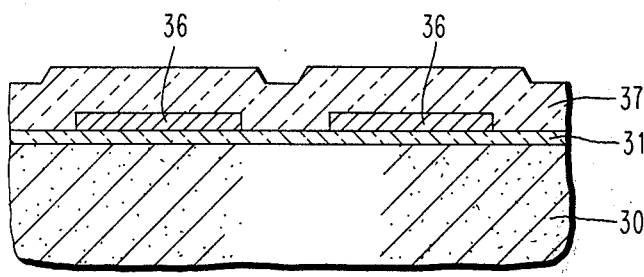
Figure 3D:
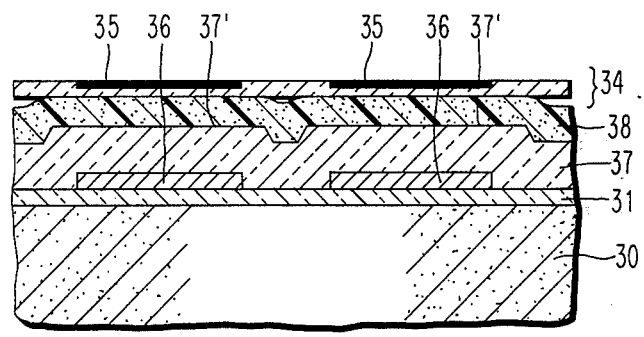

Next, FIG. 3C, the photoresist layer 33 is completely removed and a layer of silicon dioxide 37 is deposited over the surface of the structure to produce substantially the same structure as that shown in FIG. 1A. Then, FIG. 3D, a photoresist layer 38 is deposited over the surface of the struture in the same manner as previously described with respect to FIG. 1B. However, during the exposure of the photoresist to form openings therethrough coincident with elevations 37' in silicon dioxide layer 37, the same photoresist mask 34 as that used in the step shown in FIG. 3A is again used. This is possible because elevations 37' have substantially wider lateral dimensions than coincident underlying metallization lines 36. Thus, the mask previously utilized in the formation of metallization lines 36 will have narrower lateral dimensions than elevations 37' and will result in openings through photoresist layer 38 having narrower lateral dimensions than silicon dioxide elevations 37'.

From this point, on, the procedure of FIG. 1B may be followed to produce an appropriate opening through the photoresist layer and to chemically etch the exposed elevations 37' through these openings to produce a structure substantially like that of FIG. 1B, and the process continued through steps equivalent to those of FIGS. 1C and 1D to produce a final planarized structure substantially the same as that of FIG. 1B.

In this connection, it will be evident to those skilled in the art that even where metallization pattern 36 is formed by conventional "lift-off" techniques in place of the selected etching techniques shown in FIGS. 3A – 3D, the same photoresist exposure mask initially used to form the metallization pattern by the lift-off technique may subsequently be utilized for the exposure of the photoresist layer over the elevated silicon dioxide layer in the formation of openings through this subsequent photoresist layer.

While the invention has been particularly shown and described with reference to the preferred embodiments thereof, it will be understood by those skilled in the art that various changes in form and details may be made therein without departing from the spirit and scope of the invention.

What is claimed is:

1. A method of forming a planar electrically insulative layer over a non-planar integrated circuit substrate having raised portions comprising
    forming a plurality of recesses in a silicon substrate,
    forming over said substrate, an electrically insulative layer whereby said layer has elevations corresponding to the underlying unrecessed portions of said substrate,
    forming on said electrically insulative layer a masking layer of photoresist material having at least one opening therethrough coincident with an elevation in said insulative layer, said opening having smaller lateral dimensions than said coincident elevation,
    etching to planarize the portion of said elevation exposed in said opening to the level of the unelevated portions of said insulative layer,
    removing said masking layer, and
    resputtering said deposited insulative layer for a period of time sufficient to planarize the remainder of said etched elevation to the level of the unelevated portions of said insulative layer.

2. The method of claim 1 wherein said resputtering is RF resputtering.

3. The method of claim 2 wherein said etching is chemical etching.

4. The method of claim 2 wherein said masking layer has openings therethrough coincident with all of the elevations in said electrically insulative material, said openings respectively having smaller lateral dimensions than said coincident elevation,
    whereby said electrically insulative layer is fully planarized.

5. The method of claim 4 wherein all of said openings through the photoresist masking layer respectively have lateral dimensions smaller by the same amount from said coincident elevation whereby subsequent to etching, the remaining portion of said elevation will have the same lateral dimensions irrespective of the initial lateral dimension of said elevation.

6. A method of forming a planar electrically insulative layer over an integrated circuit substrate having a conductive raised line pattern comprising
    forming by photolithographic fabrication on said substrate, a metallic raised line pattern utilizing a photoresist exposure mask defining said pattern,
    then, depositing over said substrate an electrically insulative layer whereby said layer has elevations corresponding to the underlying portions of said raised line pattern,
    forming on said electrically insulative layer, by utilizing said exposure mask, a masking layer of a photoresist material having at least one opening therethrough coincident with an elevation in said insulative layer, said opening having smaller lateral dimensions than said coincident elevation,
    etching to planarize the portion of said elevation exposed in said opening to the level of the unelevated portions of said insulative layer,
    removing said masking layer, and
    resputtering said deposited insulative layer for a period of time sufficient to planarize the remainder of said etched elevation to the level of the unelevated portions of said insulative layer.

7. The method of claim 6 wherein said resputtering is RF resputtering.

8. The method of claim 7 wherein said etching is chemical etching.

9. The method of claim 6 wherein said masking layer has openings therethrough coincident with all of the elevations in said electrically insulative material, said openings respectively having smaller lateral dimensions than said coincident elevation, whereby said electrically insulative layer is fully planarized.

10. The method of claim 9 wherein all of said openings through the photoresist masking layer respectively have lateral dimensions smaller by the same amount from said coincident elevation whereby subsequent to etching the remaining portion of said elevation will have the same lateral dimensions irrespective of the initial lateral dimension of said elevation.

* * * * *